United States Patent [19]

Di Stefano et al.

[11] Patent Number: 4,570,191
[45] Date of Patent: Feb. 11, 1986

[54] OPTICAL SENSOR FOR SERVO POSITION CONTROL

[75] Inventors: Thomas H. Di Stefano, Bronxville, N.Y.; Halil B. Bakoglu, Stanford, Calif.

[73] Assignee: International Business Machines Corporation, Armonk, N.Y.

[21] Appl. No.: 632,914

[22] Filed: Jul. 20, 1984

[51] Int. Cl.[4] .......................... G11B 5/56; G11B 21/10
[52] U.S. Cl. ........................................ 360/77; 369/13; 369/122
[58] Field of Search ...................... 360/77; 369/13, 14, 369/44, 45, 112, 120, 122

[56] References Cited

U.S. PATENT DOCUMENTS

| | | | |
|---|---|---|---|
| 3,384,754 | 5/1968 | Albarda | 250/224 |
| 3,480,783 | 11/1969 | Mankarious | 250/211 |
| 3,925,817 | 12/1975 | Althuber et al. | 360/74 |
| 3,930,713 | 1/1976 | Stankewitz et al. | 350/89 |
| 3,945,037 | 3/1976 | Johnson | 360/77 |
| 4,051,528 | 9/1977 | Takeda et al. | 358/128 |
| 4,107,661 | 8/1978 | Crosby | 340/688 |
| 4,123,788 | 10/1978 | Kruger | 360/77 |
| 4,176,381 | 11/1979 | de Niet et al. | 360/77 |
| 4,243,850 | 1/1981 | Edwards | 369/46 |
| 4,275,404 | 6/1981 | Cassiday et al. | 357/19 |

OTHER PUBLICATIONS

N. Koshino et al., IEEE Trans. on Magnetics, vol. MA-G-16, No. 5, p. 631, Sep. 1980.
A. Hoagland, IBM Technical Disclosure Bulletin, vol. 20, No. 10, p. 4108, Mar. 1978.
J. Schneider, IBM Technical Disclosure Bulletin, vol. 16, No. 4, p. 1082, Sep. 1973.
D. M. Hart, IBM Technical Disclosure Bulletin, vol. 16, No. 9, p. 3020, Feb. 1974.
R. Scranton, IBM Technical Disclosure Bulletin, vol. 25, No. 12, p. 6432, May 1983.

Primary Examiner—George G. Stellar
Attorney, Agent, or Firm—Jackson E. Stanland

[57] ABSTRACT

This optical sensor has cylindrical symmetry and is comprised of a semiconductor light source/light detector combination and an optical element comprising a single lens, where the sensor is particularly suitable for uses in accurate position detection in data recording systems. In a preferred embodiment, the light source is a forward-biased p-n junction, while the light detector is a reverse-biased p-n junction located below the light source and coaxial therewith. Light from the source is directed to a point on a data recording medium and the light reflected therefrom passes through the light source to the light detecting junction. The ac signal corresponding to the reflected light is an indication of the position of the recording head with respect to the data storage medium.

18 Claims, 19 Drawing Figures

OPTICAL SENSOR FOR SERVO POSITION CONTROL

DESCRIPTION

1. Field of the Invention

This invention relates to optical sensing devices for servo-positioning in magnetic recording systems, and more particularly to a light weight, high resolution optical sensor employing an axially symmetric arrangement of a light emitter, a light detector, and a single cylindrically symmetrical lens.

2. Background Art

The use of optical sensors to detect optical servo tracks on a magnetic disk is well known in the art, and many designs have been presented. In general, a light signal is directed to the magnetic recording disk medium and a reflected light signal is detected to provide an indication of the position of a magnetic head with respect to the tracks on the magnetic recording disk medium. The accuracy with which the magnetic head is positioned relative to the tracks dictates the distance to be maintained between adjacent tracks on the information recording medium, and also determines the density of the information storage. That is, it determines the amount of information which can be stored in a given amount of area on the information recording medium. The following references generally deal with various types of optical servo systems useful in magnetic recording:

1. D. M. Hart, IBM Technical Disclosure Bulletin, Vol. 16, No. 9, page 3020, February 1974.
2. A. S. Hoagland, IBM Technical Disclosure Bulletin, Vol. 20, No. 10, page 4108, March 1978.
3. U.S. Pat. Nos. 3,925,817; 4,123,788; and 4,176,381.
4. N. Koshino et al, IEEE Trans. on Magnetics, Vol. Mag. 16, No. 5, page 631, September 1980.
5. R. A. Scranton, IBM Technical Disclosure Bulletin, Vol. 25, No. 12, page 6432, May 1983.
6. U.S. Pat. No. 4,275,404.

Generally, it is desirable that the optical sensor be of very light weight and small size, and be of low cost so as not to add appreciable expense to the magnetic heads and circuits used for detecting magnetically recorded information. It is also desirable that the optical sensor be mounted on the slider, or arm, which also contains the magnetic recording/reading head. The cited references show many designs, some of which include an optical sensor which is mounted on the slider holding the read/write head.

It is also desirable to provide an optical sensor in which the light emitting portion thereof and the light receiving portion thereof are located on the same structure, and in particular a monolithic structure such as a semiconductor wafer. This sort of approach is described in aforementioned references 5 and 6 where light emitting diodes (LED) and light detectors are formed in the same semiconductor structure. In reference 5, the light source and light detector can be a GaAs structure where the active layers of the light emitter and light detector are in the same plane. Light reflected from the surface of a magnetic disk is transmitted back through the light emitter to the detector, in an arrangement where it is necessary to make the light emitter sufficiently transparent to the reflected light. However, there is a critical alignment required in this type of structure since the light detector has to be properly and accurately aligned with respect to the light emitter in order to satisfactorily collect the reflected light from the disk.

In aforementioned reference 6, monolithic optoisolator is described in which a light emitting diode and a photo diode are fabricated from the same epitaxial semiconductor layer. The light emitting diode is located at the center of the structure, and is surrounded by a generally annular photodiode. A graded bandgap structure is used and the light emitting diode and light receiving photodiode are electrically isolated from one another by channels which extend through the semiconductor into the substrate of the structure.

The device of reference 6 is used to perform the function of an optical transformer, in that it optically couples an input signal to an output circuit in order to provide an output signal in a circuit in which there is complete electric isolation between the input circuit and the output circuit. It is not used as a sensor for servopositioning a magnetic head, or in applications where light has to be directed to an external surface and reflected therefrom for collection by a photodetector.

In optical servosystems, it is generally difficult to provide proper alignment between the light emitter and the light detector, as well as between the emitter-detector combination and the optical system (lens, etc.) which is used for imaging the light onto another surface and for receiving the light reflected therefrom. The requirements of critical alignment and/or dimension in such prior systems involve additional cost and complexity, making these systems unattractive especially in high density recording. Accordingly, it is a primary object of this invention to provide an improved optical servo sensor for use in applications where precise positioning of a magnetic write/read head is required, and wherein no critical alignments or dimensions, to a first order, are required.

In many types of optical sensors used, for example, in servo applications, complex optical elements are required to couple light from the source to the magnetic recording surface and back to the photodetector. Accordingly, it is another object of the present invention to provide an improved optical servo sensor which requires only a single optical element that can be of very low cost.

In optical servo systems of the type using optical sensors, it is very important to provide a high resolution sensor, especially when ultra high recording densities are required. It is also important that the optical sensor be of low cost, small size, and light weight so that it can be incorporated in, for instance, magnetic head assemblies used to read and write information into a magnetic recording medium. Accordingly, it is another object of the present invention to provide an improved optical servo sensor where the optical sensor is of small size and light weight, and can be fabricated very cheaply.

In optical sensors using light emitting diodes and photo detectors on the same semiconductor chip, it has often been the situation that the close proximity of these elements on the same substrate caused electrical and optical cross-talk between the light source and the light detector. A large amount of direct light from the light source to the detector can saturate the detector and thereby render ineffective the detection of the reflected light signal. Accordingly, it is another object of the present invention to provide an improved optical servo sensor in which the light source and the light detector are located in the same semiconductor substrate and very close to one another, without problems of ac electrical and/or optical cross-talk therebetween.

As noted previously, any required critical alignment or critical dimension will create additional costs and will add complexity to the optical servo sensor. As an example, in such sensors any deviation from alignment will adversely affect the performance of the device, and this will become increasingly more severe as the demands upon resolution are increased. Accordingly, it is another object of the present device to provide an improved optical servo sensor in which any deviation from alignment will have negligible effect to a first order, and will not adversely affect the servoing performance of the sensor.

It is another object of the present invention to provide an improved optical servo sensor having the characteristics described in the preceeding objective, where the light source and the light detector are made by a technique providing self-alignment therebetween, and wherein the alignment of the light source/detector combination and the single optical element required for imaging is also not dependent on critical alignments or dimensions, to a first order.

DISCLOSURE OF INVENTION

A very light weight and simple optical servo sensor is provided which can be integrated into data recording systems in order to sense positioned markings that allow accurate servo positioning of a read/write head relative to the data recording surface. It is of very low cost and provides high resolution, and can therefore be integrated in a magnetic head or head slider assembly.

The servo sensor is comprised of a semiconducting light source, such as a light emitting diode (LED) fabricated of a p-n junction, a light detector also comprising a p-n semiconductor junction, where the light source and light detector are located in the same semiconductor chip, and an optical element which is comprised of a single, very simple lens. The entire system is axially symmetric in that the overall structure has cylindrical symmetry, the light source, reflected light detector, and lens being located on a common axis. Due to the cylindrical symmetry, there are no critical alignments or dimensions (to a first order) in this system.

The optical servo sensor is a portion of a magnetic read/write head structure, where the optical sensor can be located in the slider, or arm, used to house the magnetic read/write head. Light is emitted by the light source and is imaged to a small spot on a magnetic recording medium, such as a disk. Light is reflected from a servo track on the disk and is imaged onto the photodetector by the single lens element. This reflected light is a measure of the positioning of the read/write head with respect to a particular track on the disk.

In this invention it is to be understood that the optical servo sensor is located on the magnetic head, or on the slider, arm, or actuator used to position the head. Thus, when it is stated that the optical servo sensor is a part of the magnetic head structure, or located on the magnetic head, any of the above-mentioned locations (arm, slider, etc.) are included and intended.

In a preferred embodiment the light detector is located in the same chip of material as the light source and the two are aligned axially. The p-n junction of the light detector is located below the p-n junction of the light emitting source, where both junctions are in the same semiconductor chip. Light which is reflected from an object has to pass through the light source in order to reach the light detector in this embodiment. For this reason, the bandgap of the source p-n junction is chosen to be larger than the bandgap of the detector p-n junction, and the thicknesses of the p- and n-type layers comprising the light source are sufficiently thin that a large percentage of the reflected light will pass through the light source to impinge upon the detector p-n junction. This embodiment has an advantage in that it can be used to collect light from a diffuse or specular surface. Thus, it is particularly suitable for detecting light reflected from a hard magnetic disk, whose surface is very mirror-like.

In another embodiment which is less desirable for detection of light from a mirror-like surface, but which can be used to collect reflected light from a diffuse surface, such as a floppy disc, the light deector is also located in the same axially symmetric semiconductor structure as the light source, but has an annular shape, being located around the light source and axially aligned therewith. Thus, a concentric arrangement of light source and light detector is provided, where the p-n junctions comprising the light source and the light detector are located in essentially the same plane of a single semiconductor layer. In this embodiment, the single lens element is often more complicated, since it is used to image light from the source to a small spot on the magnetic recording medium, and than to direct light reflected therefrom to an area detector (annulus) located around the light source. In one form of a suitable lens, the central portion of the lens has a shorter focal length then the peripheral portion of the lens, so that the light source is imaged to a spot while the reflected light is imaged onto the annular photodetector.

These and other objects, features, and advantages will be apparent from the following more particular description of the preferred embodiments.

BRIEF DESCRIPTION OF THE DRAWINGS

FIG. 5 is an emission spectrum of light from the light source of FIG. 2, while

FIG. 14 illustrates the alignment of the axis of the light source/detector combination and the optical element, while

BEST MODE FOR CARRYING OUT THE INVENTION

Figure 1:
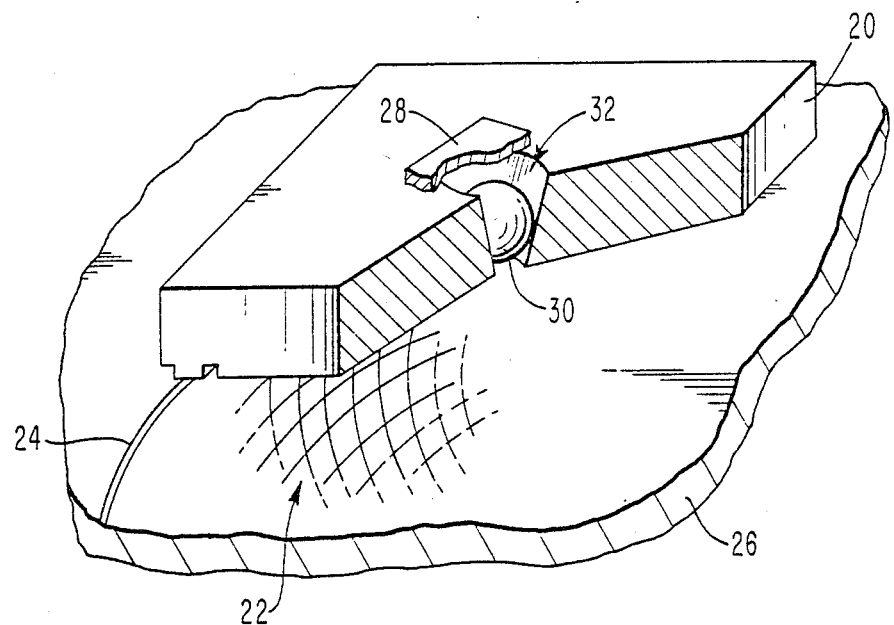
FIG. 1 is a schematic illustration of a magnetic head structure including the optical servo sensor of the present invention, which is used to detect optical servo tracks on a data storage disk.

FIG. 1 illustrates a data recording system and the alignment of a read/write head 20 with respect to an optical servo pattern 22 and a data recording track 24, the servo pattern 22 and data track 24 being located on a disk 26. These tracks and the structure of the disk are well known in the art, and include both hard and floppy disks. The read/write head 20 is located above the disk 26 at a height which is chosen in accordance with the recording system, in a manner also well known in the art.

The optical position sensor of the present invention is a portion of head 20 and is comprised of a light source-light detector couple 28 and a single axially symmetric optical element 30, which in this case is a spherical lens. Although the lens 30 and semiconductor chip comprising the light source/detector couple 28 are shown large in this figure, these elements are very small in accordance with the recording density required on magnetic disk 26. In a representative example, the distance from the top surface of head 20 to the top surface of disk 26 is approximately 30 mils, and the diameter of spherical lens 30 is about 7.5 mils. The lens 30 sits in a cone-shaped aperture 32 in head 20, the diameter of the aperture at the top surface of head 20 being, for example, about 45 mils. Of course, these figures can be varied in accordance with the recording system, but are representative of the dimensions of the optical servo sensor of the present invention, and illustrate that this sensor device can be made very small to accommodate all types of data recording systems.

In the use of the position sensor of FIG. 1, light from the source is imaged onto a small spot (point) of the disk 26 by the lens 30, and the light reflected from that point is collected by lens 30 and sent to the light detector, which is also a part of the semiconductor chip comprising the light source/light detector couple 28. An ac signal is detected indicating the change of light received by the detector, which in turn is a measure of the position of the head 20 with respect to a desired recording track.

Figure 2:
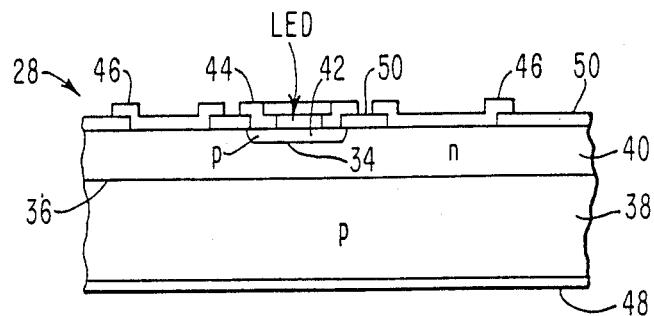
FIG. 2 is a cross sectional view of a semiconducting chip including a light emitting diode and a light receiving photodetector, where the p-n junction forming the light emitter is located over the p-n junction forming the light detector.

FIG. 2 is a schematic diagram of a cross-section of the semiconductor chip which comprises the light source/light detector couple 28. In this embodiment, the light source is a forward biased p-n junction 34, while the light detector is a reverse biased p-n junction 36. The semiconductor structure is comprised of the p-type layer 38, the n-type layer 40, and the p-type layer 42. An ohmic contact 44 is made to the light emitting diode, while an ohmic contact 46 is made to the light detector. The area of the light source through which light travels to the disk is designated LED, standing for "light emitting diode." A layer 48 of electrically conductive material is located on the bottom of the semiconductor chip, and serves as an ohmic contact to complete the electrical biasing for the light emitting junction 34 and the light detecting junction 36. An oxide layer 50 is used to provide electrical isolation between the ohmic contacts 44 and 46.

Figure 3:
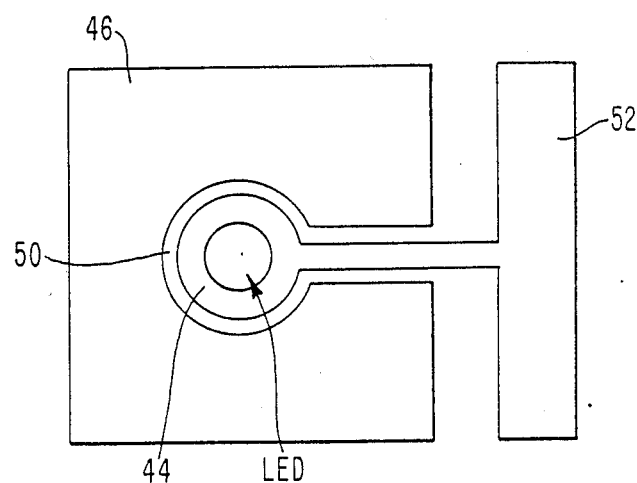
FIG. 3 is a schematic top view of a portion of the structure of FIG. 2, and is used to illustrate the electrical contacts to the light source and light detector.

FIG. 3 is a top view of the structure of FIG. 2, indicating the ohmic contacts 44 and 46. From this view, it is apparent that the ohmic contact to the p-type layer 42 of the light source is generally annular in structure, and is connected to a contact band 52. The ohmic contact 46 to the detector can also be of large area, as indicated in FIG. 3.

In this embodiment, the semiconductor chip is a tri-layer structure in which the light detector junction 36 is located beneath the light emitter junction 34, so that reflected light which is to be detected must pass through the light source. By proper choice of the materials comprising layers 38, 40, and 42, the bandgaps of the materials can be chosen to make the light source substantially transparent to the reflected light.

Another feature of the structure of FIG. 2 is that there is cylindrical symmetry between the light source and the light detector. This cylindrical symmetry extends also to the optical element 30 (FIG. 1) so that the entire optical sensor has cylindrical symmetry. Due to this symmetry, there are not critical angular alignments in this optical servo sensor, which is a feature that provides ease of manufacture and low cost, while at the same time providing good fabrication yields.

Other important features of this servo system are the minimum number of components which are required and the simplicity of these components. The light source and light detector are comprised of well known semiconducting materials such as GaAs and GaAlAs. By varying the amount of Al, the bandgap of the semiconductor can be changed, as is well known in the art. For example, the p-type layer 38 can be comprised of GaAs, while the n-type layer 40 can be comprised of GaAlAs. P-type layer 42 is produced by implanting impurities, such as zinc, into the GaAlAs layer 40. Of course, other semiconducting materials, including III-V and II-VI compounds, can be used to form the light emitting and light detecting junctions.

Figure 4:
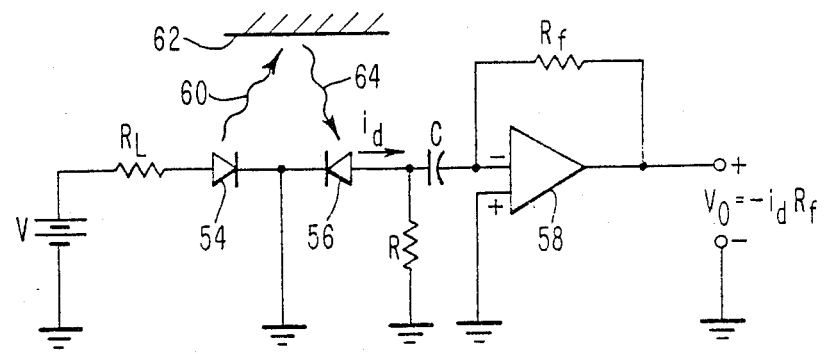
FIG. 4 is a schematic illustration of the electrical equivalent of the light source and light detector, and also includes the electrical circuitry used to produce an output electrical signal indicative of the light reflected from a servo mark on a magnetic recording medium.

FIG. 4 schematically illustrates the electronic circuitry representing the light emitting and light detecting diodes and the arrangement of components used to provide an output signal. In this figure, the forward biased p-n junction 34 comprising the light source is indicated by diode 54, while the p-n junction 36 used for the light detector is indicated by the diode 56. The R-C circuit is a high-pass filter used to filter out dc components in order to allow only the ac component to pass to the current detecting amplifier 58, to which is connected a feedback resistor $R_f$. Biasing for the light source 54 is provided by the source V, which produces a current through resistor $R_L$. The light provided by source 54 is indicated by the arrow 60, while the light reflected from the data storage disk 62 is indicated by the arrow 64. Light 64 is collected by the detector 56, producing a diode current $i_d$ which flows toward the detecting amplifier 58. The voltage $V_O$ across resistor $R_f$ indicates the output signal.

In operation, light will be provided directly from the light source to the detector in the buried detector embodiment of FIG. 2. However, this will produce a dc component of current in the detector which is filtered out by the RC circuit in order to eliminate this dc offset. The direct light from the light source will not affect the performance of the device as long as it does not saturate the light detector, and as long as the noise due to the direct light from the source is much smaller than the signal due to the reflected light.

Figure 5:
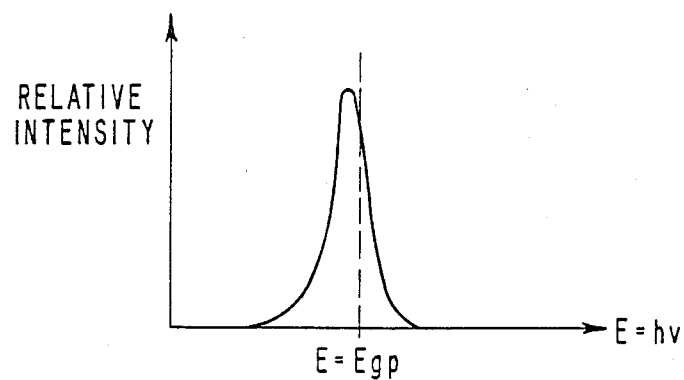
Figure 6:
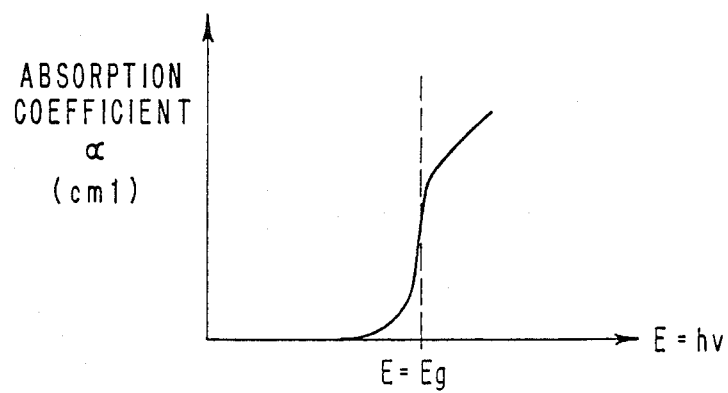
FIG. 6 is an absorption spectrum of the material of the emitting junction of conductor chip (FIG. 2), indicating that most of the reflected light passes through the light source and the n-layer without being significantly absorbed.

FIGS. 5 and 6 show the emission spectrum of the light source, and the absorption of the light emitting material in the semiconductor chip, respectively, and illustrate that the reflected light will pass through the light source to the light detector.

In more detail, FIG. 5 plots the relative intensity of the light emitted as a function of the energy of the light, where the quantity $E = E_{gp}$ is the bandgap of the p-type side of the emitter junction 34 (FIG. 2). Most of the light emitted by the forward biased junction 34 is at a frequency close to this bandgap.

FIG. 6 plots the absorption of the semiconductor material, and shows the absorption coefficient $\alpha$ as a function of the energy (and therefore, the frequency) of the absorbed light. The intensity I (x) as a function of distance into the emitting semiconductor material, where x is measured from the top surface of p-layer 42, is an exponential function of distance x. The absorption coefficient of the semiconductor material does not increase appreciably for the wavelengths of the reflected light, and therefore most of the reflected light goes through the p-layer 42 without being absorbed.

OPTICAL ELEMENT VARIATIONS (FIGS. 7-10)

Figure 7:
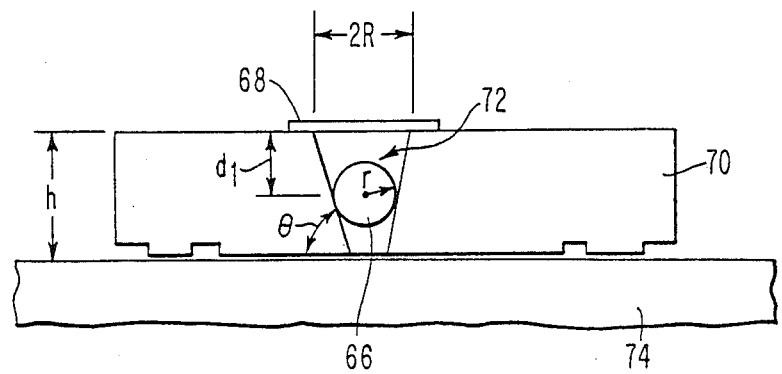
FIGS. 7-10 illustrate different types of lenses for use in this optical servo sensor, and further indicate the arrangements of these lens in read/write heads used in data recording systems.

These figures show several different shapes for the optical element of this centrosymmetric optical sensor, where FIG. 7 illustrates the use of a glass sphere 66 as the optical element. This embodiment is the same as that illustrated in FIG. 1, and is used to indicate some of the dimensional quantities to be discussed later with respect to the size of the different elements of the system, and their relative placements. Thus, glass sphere 66 is an optical element used to image light from the semiconductor chip 68 housing the light source/light detector couple. Semiconductor chip 68 is mounted on magnetic read/write head 70, and is particularly located over one end of a cone-shaped aperture 72 which extends from one surface of head 70 to the opposite surface. A data storage medium (disk) 74 is located beneath the read/write head 70, and contains optical servo tracks which are to be detected in order to properly position head 70.

In FIG. 7, the spherical lens 66 can be dropped into the tapered hole 72 and secured with epoxy. This optical system does not require any alignment, and the relative placement of the lens 66 with respect to the source-detector chip 68 and the reflective surface of disk 74 is determined by the geometry of the tapered hole 72, the radius r of the spherical lens 66, and the flight height of the read/write head 70. As will be more clear later, the dimensions of this overall optical system are critical only to a second degree.

Figure 8:
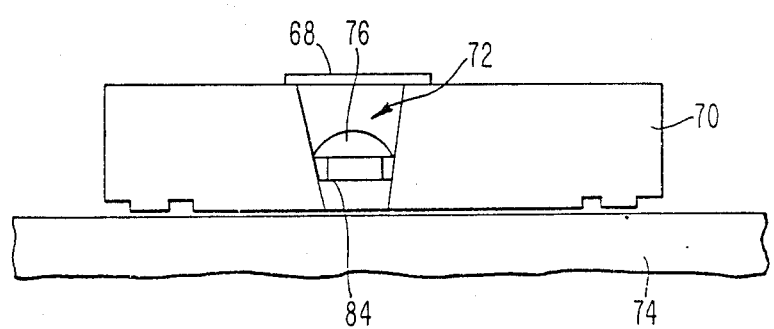
Figure 9:
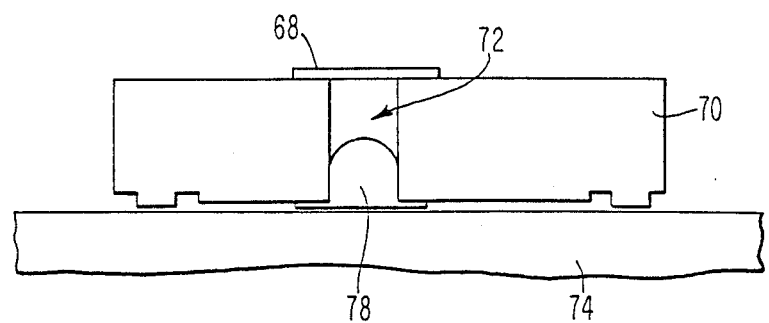
Figure 10:
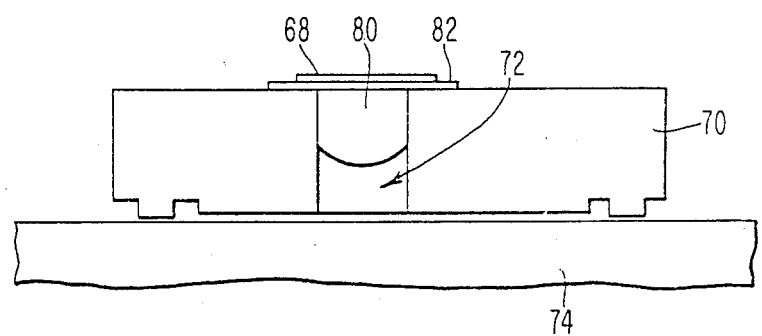

The simple glass bead 66 will function adequately as a spherical lens, such that the optical aberrations will cause a small amount of light to fall outside of the central aperture of the detector. The resolution and the depth of field can be improved by using a plano-convex lens 76 (FIG. 8) or a molded lens 78 (FIG. 9) or 80 (FIG. 10). In these figures, the same reference numerals are used for the source-detector chip 68, the read/write head 70, the aperture 72 in which the lens is located, and the data storage disk 74. In FIG. 10, a transparent window 82 (such as glass) is also provided between the semiconductor 68 and the lens 80. In FIG. 8, an opaque washer 84 is used to support the plano-convex lens 76.

Operation of the optical system comprising the source-detector chip 68 and the optical elements 76, 78, and 80 is the same as that described previously with respect to the optical system of FIG. 1.

Generally, the lens 66 in FIG. 7 is placed halfway between the source-detector couple 68 and the disk 74. This can be varied, of course, but placement at approximately the center of this distance means that variations in placement will cause minimum effects on the focus of the projected spot of light.

If there is a small displacement $\Delta x$ in the placement of the lens midway between the source-detector couple 68 and the top surface of the disk 74, a small error in focal position $\epsilon$ will arise. This error is zero to a first degree of approximation, and is given by the following expression for a second degree approximation:

$$|\epsilon| \simeq (\Delta x)^2 / f$$

A perturbation in the angle $\theta$ will give rise to a small second order error, as will a perturbation in the distance R. However, a perturbation in the radius r will affect the focal length f and, to a first degree approximation the error $\epsilon$ due to a perturbation $\Delta r$ is given by the following expression:

$$|\epsilon| = \frac{2|\Delta r|}{n - 1}$$

Therefore, r is the most critical dimension in the optical system. In practice, the glass bead lenses would be sorted by radius in order to ensure accuracy.

The embodiment of FIG. 1 using a buried detector is very advantageous for detecting the optical signal reflected from either a diffuse scattering surface, or a mirror-like surface. As such, it is particularly suitable in an optical servo mechanism of a rigid magnetic disk storage system. Due to the small size and light weight of this axially symmetric optical sensor, it can be directly attached to the magnetic read/write head without affecting the performance of the head position controlling actuator.

SERVO SENSOR FOR DIFFUSE REFLECTORS (FIGS. 11-19)

The embodiments shown in FIGS. 11-19 are particularly suitable as servo elements with diffuse reflectors such as floppy disks. However, these embodiments are not as suitable for mirror-like reflecting surfaces, due to the placement of the detector as an annular element surrounding the light source.

Figure 11:
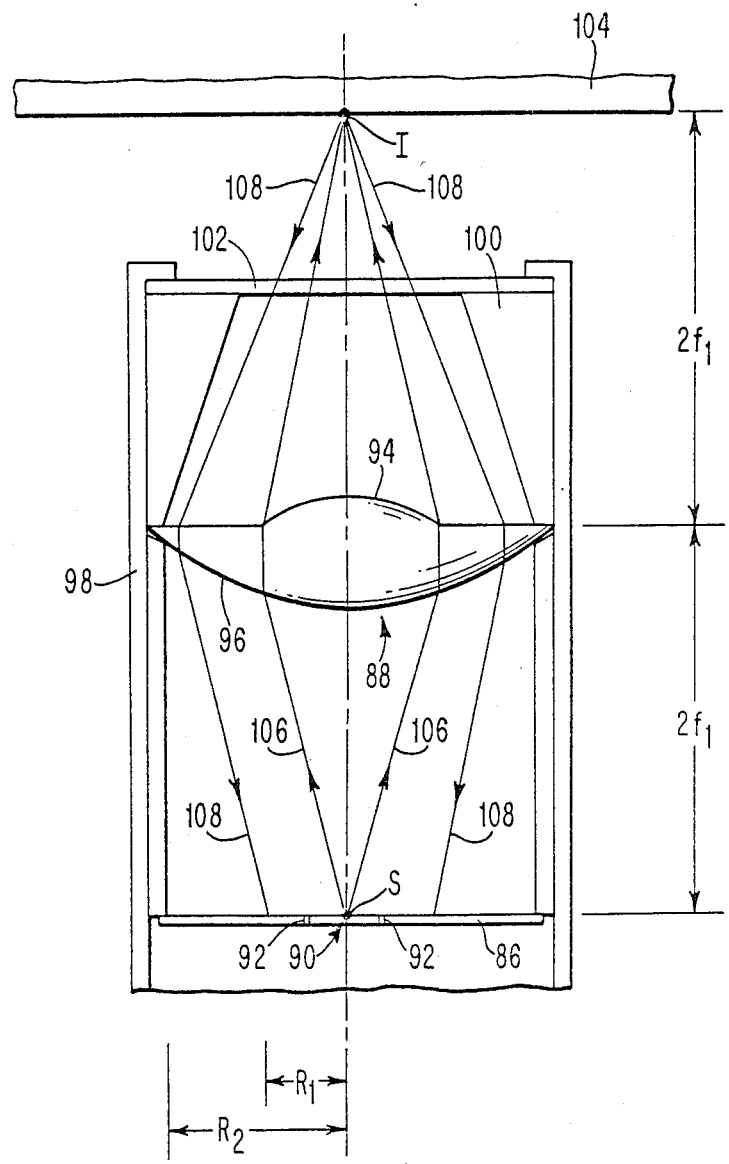
FIG. 11 illustrates another embodiment of the present invention in which the light detector is an axially symmetric structure surrounding the light source, and the optical element is a more complex lens having portions thereof with different focal lengths.

In more detail, FIG. 11 shows an optical sensor comprising a single semiconductor chip 86 and a complete lens 88. Semiconductor chip 86 includes a light source 90 and a coaxial annular light detector 92. Details of the semiconductor chip will be apparent from FIG. 12. Lens 88 includes a central portion 94 having a first radius of curvature and an outer portion 96 having a different radius of curvature. Consequently, the focal lengths of the two portions 94 and 96 are different.

Semiconductor chip 86 and lens 88 have cylindrical symmetry with respect to one another, and are located on a common axis in the support cylinder 98, which is comprised of a light-opaque material, such as a metal. A washer 100 supports the lens 88 and is fabricated of a light absorbing material, such as a plastic. A glass window 102 is located on the top surface of the structure. The device is located at a distance from the magnetic disk 104 such that light from the source 90 will be imaged to a point on the surface of disk 104.

In the operation of the sensor of FIG. 11, composite lens portion 94 has a shorter focal length than the outer lens portion 96. Therefore, lens portion 94 can focus the light source 90 to a point I on disk 104, while the diffused reflected light from point I is collected by the outer lens portion 96. Since the focal length of the lens portion 96 is larger, the collected diffused light is imaged over an area which includes the annular detector 92. This is indicated by the light rays 106 from the source which are focussed at point I, and by the diffuse reflected rays 108, which are imaged over an area including the detector 92.

Figure 12:
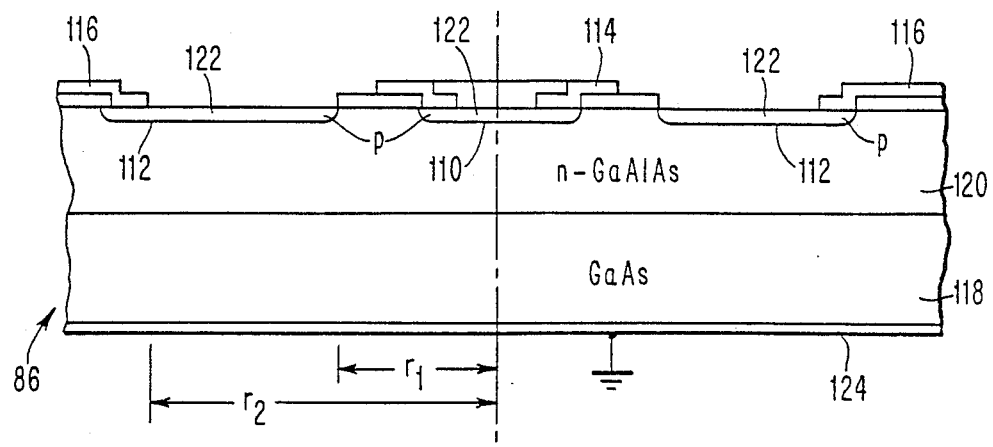
FIG. 12 is a cross-sectional view of the semiconductor chip in which a light source and light detector are formed, illustrating that the light detector has an axially symmetric structure, and is concentric with the light source.

FIG. 12 shows in more detail the semiconductor chip 86, which includes a light emitting p-n junction 110 and a light detecting p-n junction 112. The light emitting junction 110 is forward-biased, while the light detecting junction 112 is reverse-biased. Ohmic contacts 114 are provided to the light source, while ohmic contacts 116 are provided to the light detector. These contacts have the same physical geometry as the ohmic contacts shown in FIG. 3. The semiconductor chip 68 includes a substrate 118 of GaAs, and an n-type layer of GaAlAs. P-type regions 122 are diffused or ion implanted into layer 120 to create the light source junction 110 and the light detector junction 112. A metal layer 124 on the back of the GaAs substrate 118 serves as an ohmic contact.

The electrical circuit for the semiconductor chip 86 is the same as that shown in FIG. 4. The high pass filter comprised of the RC network is not required here, since the dc electrical and optical cross-talk between the light source and the light detector is negligibly small in this embodiment, even though they are built on the same semiconductor chip. Thus, only a very small amount of direct light travels from the light source to the light detector, and there is no danger of saturation of the detector. The light source and the light detector are arranged concentrically on the chip 68. The light source is in the center and is much smaller than the detector in order to obtain a small spot size at location I on disk 104. The light detector is an area detector comprising an annular shaped junction area.

Figure 13:
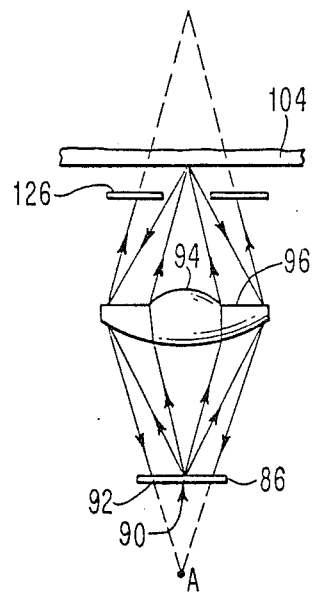
FIG. 13 illustrates the use of an aperture in the embodiment of FIG. 11.

As noted previously, the outer portion 96 of the composite lens has a longer focal length than the inner portion, and therefore images the illuminated spot I to a point A behind the semiconductor chip 86, as shown in FIG. 13. However, the light coming from the outer lens section 96 is intercepted and detected by the circular, large area detector 92.

The outer composite lens section 96 not only collects light from the illuminated spot I, but also collects light from the source 90 and illuminates a ring around the spot I. In order to minimize this undesirable illumination, an aperture 126 is placed at the window of the sensor. The supporting washer 100 in FIG. 11 serves as an aperture, also.

Figure 14:
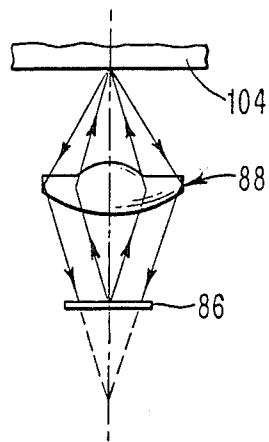
Figure 15:
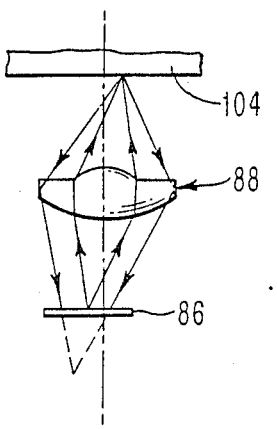
FIG. 15 illustrates a situation in which the axes of the light source/detector combination and the optical element are misaligned.

The alignment of optical elements 88 with a source-detector couple is generally a crucial aspect in the fabrication of optical sensors. However, the cylindrical symmetry of the present device makes the alignment relatively less important. This is illustrated by FIGS. 14 and 15, where FIG. 14 illustrates the case where the lens 88 and source-detector couple are aligned, while FIG. 15 illustrates the situation when the axis of the lens and the semiconductor source-detector couple are misaligned. As is apparent from FIGS. 14 and 15, any deviation from alignment will be self-correcting and will not affect the performance of the device, to first order in the misalignment.

Figure 16:
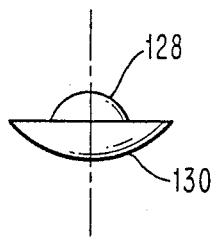
FIGS. 16–19 illustrate different types of lens which can be used in place of the optical element in the embodiment of FIG. 11.

FIGS. 16–19 show different optical elements which can be used in place of the optical element 88 of FIG. 11. In FIG. 16, two plano-convex lenses 128 and 130 are combined to form the composite lens. These lenses have different diameters, but the overall structure is similar to that of lens 88 in FIG. 11. The axes of the two lenses 128 and 130 do not require precise alignment in order to form a suitable optical element.

Figure 17:
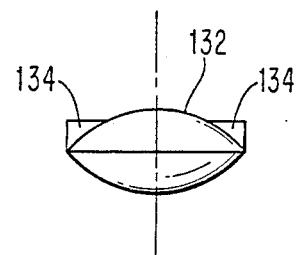

In FIG. 17, a lens 132 is used, having a transparent coating 134 (such as epoxy) on its outer region. This composite lens has an advantage in that it is very easy to fabricate.

Figure 18:
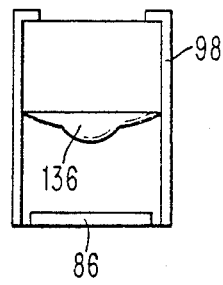

In FIG. 18, a molded composite lens 135 is shown in the container tube 98, where the semiconductor chip 86 is located at the bottom of this container. A molded lens, such as lens 136, is very inexpensive to fabricate in large quantities.

Figure 19:
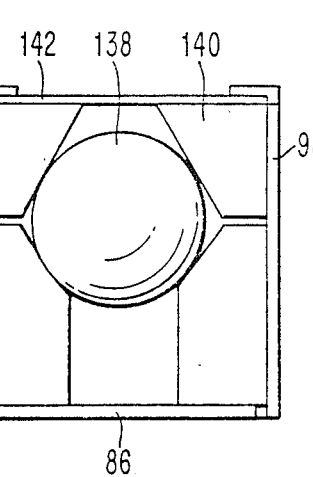

FIG. 19 illustrates the use of a spherical lens 138 which is supported by the holding structure 140 located in the optical tube 98. A window 142 is located on one end of the structure 98, while the semiconductor chip 86 is located at the other end. In this structure, the aberrations of a spherical lens 138 are used to collect light and to image it onto the annealing detector. Although this is a very inexpensive alternative, its efficiency will not be as good as the efficiency obtainable using the previously mentioned lens elements.

The centro-symmetric symmetry of the arrangement shown in FIG. 11, and the alternatives thereto, minimize the problems of misalignment and critical dimensions. Composite lens 88 is located midway between the light source and the object, in order to allow tolerance on the positioning of the lens. For a lens located midway between chip 86 and the disk 104, and for the total distance between the light source and the object being 2 $f_1$, where $f_1$ is the focal length of the central section 94 of the lens 88, the range for the focal length $f_2$ of the outer lens portion 96 is given by the following expression:

$$2f_1 > f_2 > f_1.$$

The inner and outer radii $r_1$ and $r_2$ (see FIG. 12), respectively, of the annular light detector are given by the following expressions:

$$r_1 = \frac{2(f_2 - f_1)}{f_2} R_1$$

$$r_2 = \frac{2(f_2 - f_1)}{f_2} R_2,$$

where $R_1$ and $R_2$ are the radii of the inner and the outer portions of the lens respectively as indicated in FIG. 11.

As mentioned previously, the embodiment of FIG. 11 is used for disks with diffusely reflecting surfaces. If the object 104 were a perfectly reflecting mirror, light would not be scattered from the object to the detector but instead would be reflected back to the source. Thus, the embodiment of FIG. 11 is more suitable for use with diffuse reflectors, such as floppy disks.

What has been described is a very simple optical sensor for use in servo positioning of read/write heads in data recording systems, such as magnetic recording systems. A single semiconductor chip is used to house a light source and a light detector, and the optical imaging element is a single lens. Cylindrical symmetry is maintained in order to minimize problems such as misalignment and the need for maintaining rigid dimensions of the components of the system.

While the invention has been described with respect to particular embodiments thereof, it will be appreciated by those of skill in the art that variations can be made therein, without departing from the spirit and scope of the present invention.

Having thus described our invention, what we claim as new and desire to secure by Letters Patent is:

1. A servo positioning system for data recording, comprising a data recording head assembly for writing information into and reading information on a discoid data storage medium,
    a light source for providing light which is imaged onto a small spot on said data storage medium,
    a light detector, axially aligned with said light source, said light source and light detector being in the same semiconductor chip,
    a single composite lens co-axially aligned with said light source and said light detector, said single lens imaging light from said light source onto said data storage medium and also imaging light reflected from said data storage medium to said light detector, said light detector producing an electrical servo signal in response to said reflected light,
    said composite lens being positioned substantially midway between said light source and said data storage medium,
    said light source, light detector, and single lens being centrosymmetric and having cylindrical symmetry, and being located on said recording head assembly, the position of said recording head assembly being controlled by said electrical servo signal.

2. The system of claim 1, where said light detector is an area detector comprising an annulus around said light source, and wherein said composite lens has at least two portions having different focal lengths, the focal length for imaging light from said source onto said storage medium being less than the focal length for imaging light from said storage medium to said light detector.

3. The system of claim 1, where said light detector is located below said light source in said semiconductor chip, wherein light reflected from said data storage medium passes through said light source to said detector, the semiconductor material comprising said light source being substantially transparent to said reflected light.

4. The system of claim 3, wherein said light source and said light detector are p-n junctions in said semiconductor chip, and where the bandgap of the light source junction is greater than the bandgap of said light detector junction.

5. A system of claim 3, wherein said light source junction is forward biased and said light detector junction is reverse biased.

6. The system of claim 1, wherein said single lens is a spherical lens located substantially midway between said semiconductor chip and said data storage medium.

7. A servo-position control system for data recording, including the following:
    a recording medium having servo marks thereon to be detected optically and used for positioning a read/write head,
    a read/write head for reading information from and writing information into said recording medium,
    an optical sensor located on said read/write head for providing an electrical servo signal to servo-position said read/write head, said sensor including:
        a semiconductor chip including a light emitting diode (LED) located in a surface of said semiconductor chip, said LED producing light which is imaged onto said servo marks,
        a light detector located in said semiconductor chip, said light detector being axially aligned with said LED and located below said LED in said semiconductor chip, said detector producing an electrical servo signal in response to light striking it,
        a single lens for imaging light from said LED to a small spot on said servo marks, and for imaging light reflected therefrom onto said light detector to produce said electrical servo signal, said reflected light passing through said LED to said detector, wherein said LED, light detector, and single lens exhibit cylindrical symmetry and are substantially symmetric about a common axis, the servo signal provided by said light detector being used to position said read/write head.

8. The system of claim 7, wherein said single lens is a spherical lens.

9. The system of claim 8, wherein said spherical lens is located approximately midway between said semiconductor chip and said recording medium.

10. The system of claim 7, where said single lens is a plano-convex lens.

11. The system of claim 7, where said LED is a forward biased p-n junction, and said light detector is a reverse biased p-n junction.

12. The system of claim 11, where said LED is substantially transparent to light reflected from said recording medium.

13. The system of claim 12, where said single lens is a spherical lens.

14. The system of claim 13, where said spherical lens and said semiconductor chip are located on said read/write head.

15. A data recording optical servo system, comprising in combination:
    a recording medium having servo marks thereon to be detected optically,
    a read/write head for reading information stored in said recording medium and for writing information into said recording medium,
    an optical sensor located on said read/write head for providing an electrical servo signal to servo-position said read/write head with respect to said recording medium, said optical sensor including
        a semiconductor chip including a light emitting diode (LED) located in the top surface of said semiconductor wafer, said LED producing light which is imaged onto said servo marks,
        a light detector located in said semiconductor chip, said light detector being concentrically arranged with respect to said LED, and comprising an annular shaped region of said semiconductor wafer, said detector producing an electrical servo signal in response to light striking it, a single composite lens for imaging light from said LED to a small spot on said servo marks, and for imaging light reflected therefrom onto said light detector, where said single composite lens has first and second portions, said first portion having a shorter focal length than said second portion and being used to image light from said LED onto a small spot of said servo marks, said second portion coaxially surrounding the first portion and having a longer focal length and imaging light reflected from said recording medium onto said annular-shaped detector, wherein said LED, said light detector, and said single composite lens exhibit cylindrical symmetry about a common axis, the servo signal produced by said light detector being used to position said read/write head.

16. The system of claim 15, where said single composite lens is a spherical lens.

17. The system of claim 15, where said lens is located approximately half way between said semiconductor chip and said recording medium.

18. The system of claim 15, where said LED is a forward biased p-n junction and said light detector is a reverse biased p-n junction.

* * * * *